United States Patent
Cowles et al.

(10) Patent No.: US 11,107,549 B2
(45) Date of Patent: Aug. 31, 2021

(54) AT-RISK MEMORY LOCATION IDENTIFICATION AND MANAGEMENT

(71) Applicant: Microsoft Technology Licensing, LLC, Redmond, WA (US)

(72) Inventors: Timothy B. Cowles, Boise, ID (US); Terry M. Grunzke, Boise, ID (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/715,468

(22) Filed: Dec. 16, 2019

(65) Prior Publication Data
US 2021/0183463 A1 Jun. 17, 2021

(51) Int. Cl.
*G11C 29/52* (2006.01)
*G11C 29/44* (2006.01)
*G11C 29/00* (2006.01)
*G06F 11/30* (2006.01)
*G11C 29/32* (2006.01)
*G11C 29/12* (2006.01)

(52) U.S. Cl.
CPC ...... *G11C 29/4401* (2013.01); *G06F 11/3037* (2013.01); *G11C 29/32* (2013.01); *G11C 29/76* (2013.01); *G11C 29/787* (2013.01); *G11C 2029/1206* (2013.01); *G11C 2029/4402* (2013.01)

(58) Field of Classification Search
CPC ..................................................... G11C 29/52
USPC ......................................................... 365/200
See application file for complete search history.

(56) References Cited

U.S. PATENT DOCUMENTS 6,128,241 A   10/2000   Choi
6,442,094 B2   8/2002   Shore
(Continued)

FOREIGN PATENT DOCUMENTS

EP   0096783 B1   11/1989

OTHER PUBLICATIONS

Minjie Lv, et al., "Logic-DRAM Co-Design to Exploit the Efficient Repair Technique for Stacked DRAM", retrieved from «https://ieeexplore.ieee.org/document/7086351», May 2015, 10 pages.
(Continued)

*Primary Examiner* — Min Huang
(74) *Attorney, Agent, or Firm* — Ogilvie Law Firm

(57) ABSTRACT

A volatile memory device is configured to self-document by identifying its own bad or at-risk excludable memory locations in a nonvolatile identification embedded in itself, without using additional board real estate. The identification of bad or at-risk memory is readable by firmware outside the device. The device includes volatile memory cells that have respective failure susceptibility values, some of which indicate bad or at-risk memory cells. The memory device also includes read logic and write logic, and may include refresh logic. The identification may be embedded in the device by blowing fuses in an adaptation of self-repair activity, or by writing identification data into a serial presence detect logic, for example. The configured memory device may efficiently, persistently, and reliably provide detailed memory test results regarding itself, thereby allowing customers to accept and safely use memory that would otherwise have been discarded to prevent software crashes.

20 Claims, 2 Drawing Sheets

(56) References Cited

U.S. PATENT DOCUMENTS

| | | | |
|---|---|---|---|
| 6,788,587 | B2 | 9/2004 | Van De Graaff |
| 8,713,374 | B2 | 4/2014 | Blodgett |
| 9,043,638 | B1 | 5/2015 | Su et al. |
| 9,812,222 | B2 | 11/2017 | Kim et al. |
| 2003/0086318 | A1 | 5/2003 | Cowles |
| 2003/0235929 | A1 | 12/2003 | Cowles et al. |
| 2004/0036524 | A1 | 2/2004 | Cowles |
| 2004/0261049 | A1 | 12/2004 | Mohr et al. |
| 2005/0041481 | A1 | 2/2005 | Koelling et al. |
| 2006/0044916 | A1 | 3/2006 | Alejano et al. |
| 2006/0120187 | A1 | 6/2006 | Merritt et al. |
| 2006/0121650 | A1 | 6/2006 | Fogal et al. |
| 2006/0242497 | A1 | 10/2006 | Cowles et al. |
| 2007/0070679 | A1 | 3/2007 | Cowles |
| 2008/0010435 | A1 | 1/2008 | Smith et al. |
| 2009/0055621 | A1 | 2/2009 | Nakanishi et al. |
| 2009/0129182 | A1* | 5/2009 | Shiah .................. G11C 5/04 365/200 |
| 2009/0224242 | A1 | 9/2009 | Cowles |
| 2011/0209011 | A1 | 8/2011 | Mohr et al. |
| 2012/0297257 | A1 | 11/2012 | Mohr et al. |
| 2012/0311297 | A1 | 12/2012 | Lee et al. |
| 2013/0329510 | A1 | 12/2013 | Keeth et al. |
| 2014/0078842 | A1 | 3/2014 | Oh et al. |
| 2014/0219000 | A1 | 8/2014 | Oh et al. |
| 2016/0093403 | A1* | 3/2016 | Kim .................. G11C 17/16 365/96 |
| 2017/0068607 | A1 | 3/2017 | Herzi et al. |
| 2017/0185499 | A1 | 6/2017 | Lee et al. |
| 2017/0308447 | A1 | 10/2017 | Wu |
| 2018/0173595 | A1 | 6/2018 | Kim et al. |
| 2018/0262215 | A1* | 9/2018 | Sharon ............... H03M 13/458 |
| 2018/0287634 | A1* | 10/2018 | Rom .................. H03M 13/3715 |
| 2020/0117594 | A1* | 4/2020 | Zhang ................ G06F 11/1048 |
| 2020/0243159 | A1* | 7/2020 | Kang .................. G11C 29/838 |

OTHER PUBLICATIONS

"Synchronous dynamic random-access memory", retrieved from «https://en.wikipedia.org/wiki/Synchronous_dynamic_random-access_memory», Oct. 1, 2019, 11 pages.

"Antifuse", retrieved from «https://en.wikipedia.org/wiki/Antifuse», Jul. 18, 2019, 5 pages.

"Memory management (operating systems)", retrieved from «https://en.wikipedia.org/wiki/Memory_management_(operating_systems)», Sep. 23, 2019, 3 pages.

"Memory map", retrieved from «https://en.wikipedia.org/wiki/Memory_map», Nov. 26, 2018, 3 pages.

"Page (computer memory)", retrieved from «https://en.wikipedia.org/wiki/Page_(computer_memory)», Oct. 16, 2019, 5 pages.

"Serial presence detect", retrieved from «https://en.wikipedia.org/wiki/Serial_presence_detect», Nov. 11, 2019, 23 pages.

"Memory refresh", retrieved from «https://en.wikipedia.org/wiki/Memory_refresh», Sep. 26, 2019, 4 pages.

"Volatile memory", retrieved from «https://en.wikipedia.org/wiki/Volatile_memory», Sep. 23, 2019, 1 page.

"Flash memory", retrieved from «https://en.wikipedia.org/wiki/Flash_memory», Nov. 6, 2019, 19 pages.

Micron, "TN-29-59: Bad Block Management in NAND Flash Memory", retrieved from «https://www.google.com/url?sa=t&rct=j&q=&esrc=s&source=web&cd=1&ved=2ahUKEwjQxuXRj-PIAhULs54KHbGdBm4QFjAAegQIBBAC&url=https%3A%2F%2Fwww.micron.com%2F-%2Fmedia%2Fclient%2Fglobal%2Fdocuments%2Fproducts%2Ftechnical-note%2Fnand-flash%2Ftn2959_bbm_in_nand_flash.pdf&usg=AOvVaw1wfLDZiBhwHIQMxLkfLI3J», 2011, 4 pages.

Dexter Johnson, "'Quasi-Non-Volatile' Memory Looks to Fill Gap Between Volatile and Non-Volatile Memory", retrieved from «https://spectrum.ieee.org/nanoclast/semiconductors/devices/quasinonvolatile-memory-looks-to-fill-gap-between-volatile-and-nonvolatile-memory», Apr. 11, 2018, 4 pages.

"Small-Block vs. Large-Block NAND Flash Devices", retrieved from «https://www.google.com/url?sa=t&rct=j&q=&esrc=s&source=web&cd=2&ved=2ahUKEwjLyfvEolvmAhXPvJ4KHZDWAwQQFjABegQICxAE&url=https%3A%2F%2Fwww.micron.com%2Fsupport%2F~%2Fmedia%2F74C3F8B1250D4935898DB7FE79EB56E7.ashx&usg=AOvVaw3i0niK_7WxzoVHEjB3jL1u», 2005, 14 pages.

"International Search Report and Written Opinion Issued in PCT Application No. PCT/US2020/058994", dated Apr. 28, 2021, 20 Pages.

* cited by examiner

AT-RISK MEMORY LOCATION IDENTIFICATION AND MANAGEMENT

BACKGROUND

Computers, smartphones, data center servers, routers, robots, vehicles, medical devices, cameras, industrial control systems, and many other computing systems use volatile memory and also use nonvolatile memory. Nonvolatile memory retains its contents after electric power is turned off, even if every battery connected to it is empty. By contrast, data stored in volatile memory will be corrupted or lost unless appropriate power is supplied often enough to that volatile memory.

Volatile memory devices are manufactured by producing a large batch of dies together on a wafer. The wafer is then cut apart, and the dies (which are sometimes called "chips") are placed in packages (which may also be called "chips"). The packages may be sold as separate items, or they may be mounted on boards. Memory packages are often mounted on DIMMs (dual inline mounted modules), for example.

But volatile memory manufacturing processes are not perfect. A die may contain some memory cells that do not work. These cells might not be found until after the die has been packaged. Sometimes flawed cells can be repaired or worked around, by performing a PPR (post package repair) or RAP (repair after packaging) procedure. PPR and RAP are perhaps most often done by memory manufacturers and other memory vendors. However, they may also be done by technologically sophisticated purchasers of memory, particularly at data centers.

PPR and RAP can only repair a limited number of memory cells, so a die is sometimes discarded even though a high percentage of the cells on the die have not failed. The die is discarded to prevent software crashes due to bad memory. Additional memory cells may fail after the PPR or RAP is done, which could also cause software to crash. As the size of memory cells decreases and the number of memory cells on a die increases, the risk that a die will have unrepaired bad cells also goes up. But discarding dies decreases manufacturing yields and increases memory cost. So it would be helpful to provide technology that reduces the need to discard dies in order to prevent software crashes.

SUMMARY

Some embodiments described in this document improve memory manufacturing yields, reduce memory cost, and help avoid software crashes due to bad memory. In particular, some embodiments embed information about at-risk memory locations of a memory package or other memory device into the device itself, in a nonvolatile identification that travels with the memory device and can be read from the memory device to manage utilization of the memory device.

Some embodiments provide a volatile memory device configured to identify bad or at-risk memory locations through a nonvolatile identification. The memory device includes volatile memory cells located, e.g., in a package. The volatile memory cells have respective failure susceptibility values. The cells include at least one bad or at-risk memory location and include multiple other not-at-risk memory locations, with the bad or at-risk memory location having a greater failure susceptibility value than the not-at-risk memory locations. The volatile memory device also includes read logic in operable communication with the volatile memory cells, and includes write logic in operable communication with the volatile memory cells. A nonvolatile identification in the device identifies the bad or at-risk memory location, and is readable from outside the device.

Some embodiments configure a volatile memory device to identify bad or at-risk memory locations through a nonvolatile identification. The memory device has volatile memory cells, including at least one bad or at-risk memory location and multiple other not-at-risk memory locations. The bad or at-risk memory location has a greater failure susceptibility value than the not-at-risk memory locations. The memory device may be configured by obtaining it, ascertaining respective failure susceptibility values for the volatile memory cells, and entering a nonvolatile identification of a bad or at-risk memory location into the memory device, thereby configuring the memory device to identify the bad or at-risk memory location outside the memory device in a nonvolatile identification that travels with the memory device.

Some embodiments obtain a memory device which is configured to identify bad or at-risk memory locations, read the identification from the memory device, and utilize the identification to perform at least one of the following: check whether the identification matches memory test results which were generated by testing the volatile memory cells of the memory device, place an at-risk memory location on a watch list identifying one or more volatile memory cells to be monitored for memory errors, repair a volatile memory cell that is located at the bad or at-risk memory location, exclude a volatile memory cell that is located at the bad or at-risk memory location from holding data within a computing system, or exclude the memory device from holding data within a computing system.

Other technical activities and characteristics pertinent to teachings herein will also become apparent to those of skill in the art. The examples given are merely illustrative. This Summary is not intended to identify key features or essential features of the claimed subject matter, nor is it intended to be used to limit the scope of the claimed subject matter. Rather, this Summary is provided to introduce—in a simplified form—some technical concepts that are further described below in the Detailed Description. The innovation is defined with claims as properly understood, and to the extent this Summary conflicts with the claims, the claims should prevail.

DESCRIPTION OF THE DRAWINGS

A more particular description will be given with reference to the attached drawings. These drawings only illustrate selected aspects and thus do not fully determine coverage or scope.

DETAILED DESCRIPTION

Overview

Figure 1:
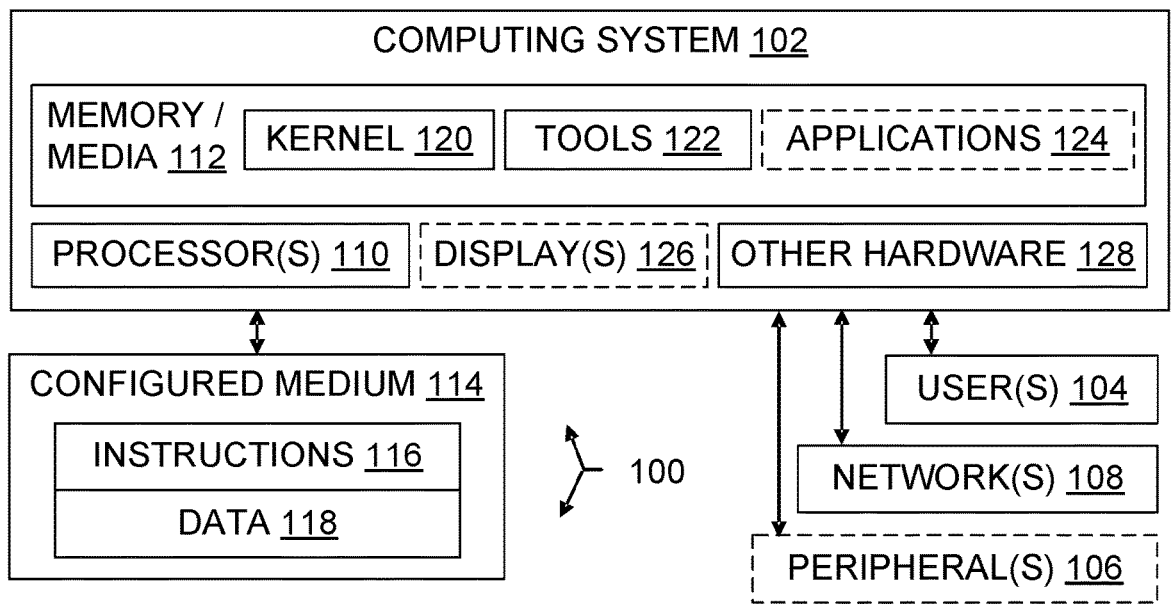
FIG. 1 is a block diagram illustrating computer systems generally and also illustrating configured storage media generally.

Innovations may expand beyond their origins, but understanding an innovation's origins can help one more fully appreciate the innovation. In the present case, some teachings described herein were motivated by technical challenges faced by Microsoft innovators who were working to improve the risk that uncorrectable memory errors will crash virtual machines. In particular, a technical challenge was to how to avoid crashes from memory cells that go bad after they are installed in a data center server.

Uncorrectable memory errors may be one of the largest causes of system downtime in a data center. When a system administrator takes a node or a virtual machine down to remedy or recover from a memory error, customer experience using the data center is harmed. This unwanted downtime may follow a particularly severe crash caused by the memory error, such as a so-called "blue screen of death" or similar system failure.

Many system kernels are able to offline known bad pages of memory, using for example a memory map. But a system's list of bad pages may contain information that is lost when the system cycles power or reboots. Moreover, because of virtualization the list of bad pages guiding one execution may be incomplete or irrelevant during another execution; a virtual machine often uses different physical memory each time the virtual machine is restarted.

Some embodiments described herein provide a persistent solution for storing and communicating those known bad locations. The solution can readily be scaled up for managing all of the memory used in an entire system. By identifying bad cell or at-risk cell locations of a memory device inside the memory device itself, in a nonvolatile manner, the solution avoids loss of relevant memory capability information on reboot or power cycling. The bad or at-risk cell locations may be entered into the device by adapting PPR procedures such as blowing fuses, or by adapting SPD logic usage, for example. These and other aspects of embodiments are described in detail below and in the drawings.

Operating Environments

With reference to FIG. 1, an operating environment 100 for an embodiment includes at least one computer system 102. The computer system 102 may be a multiprocessor computer system, or not. An operating environment may include one or more machines in a given computer system, which may be clustered, client-server networked, and/or peer-to-peer networked within a cloud. An individual machine is a computer system, and a group of cooperating machines is also a computer system. A given computer system 102 may be configured for end-users, e.g., with applications, for administrators, as a server, as a distributed processing node, and/or in other ways.

Human users 104 may interact with the computer system 102 by using displays, keyboards, and other peripherals 106, via typed text, touch, voice, movement, computer vision, gestures, and/or other forms of I/O. A screen 126 may be a removable peripheral 106 or may be an integral part of the system 102.

System administrators, network administrators, cloud administrators, security analysts and other security personnel, operations personnel, developers, testers, engineers, auditors, and end-users are each a particular type of user 104. Automated agents, scripts, playback software, devices, and the like acting on behalf of one or more people may also be users 104, e.g., to facilitate testing a system 102. Storage devices and/or networking devices may be considered peripheral equipment in some embodiments and part of a system 102 in other embodiments, depending on their detachability from the processor 110. Other computer systems not shown in FIG. 1 may interact in technological ways with the computer system 102 or with another system embodiment using one or more connections to a network 108 via network interface equipment, for example.

Each computer system 102 includes at least one processor 110. The computer system 102, like other suitable systems, also includes one or more computer-readable storage media 112. Storage media 112 may be of different physical types. The storage media 112 may be volatile memory, nonvolatile memory, fixed in place media, removable media, magnetic media, optical media, solid-state media, and/or of other types of physical durable storage media (as opposed to merely a propagated signal or mere energy). In particular, a configured storage medium 114 such as a portable (i.e., external) hard drive, CD, DVD, memory stick, or other removable nonvolatile memory medium may become functionally a technological part of the computer system when inserted or otherwise installed, making its content accessible for interaction with and use by processor 110. The removable configured storage medium 114 is an example of a computer-readable storage medium 112. Some other examples of computer-readable storage media 112 include built-in RAM, ROM, hard disks, and other memory storage devices which are not readily removable by users 104. For compliance with current United States patent requirements, neither a computer-readable medium nor a computer-readable storage medium nor a computer-readable memory is a signal per se or mere energy under any claim pending or granted in the United States.

The storage medium 114 is configured with binary instructions 116 that are executable by a processor 110; "executable" is used in a broad sense herein to include machine code, interpretable code, bytecode, and/or code that runs on a virtual machine, for example. The storage medium 114 is also configured with data 118 which is created, modified, referenced, and/or otherwise used for technical effect by execution of the instructions 116. The instructions 116 and the data 118 configure the memory or other storage medium 114 in which they reside; when that memory or other computer readable storage medium is a functional part of a given computer system, the instructions 116 and data 118 also configure that computer system.

Although an embodiment may be described as being implemented as software instructions executed by one or more processors in a computing device (e.g., general purpose computer, server, or cluster), such description is not meant to exhaust all possible embodiments. One of skill will understand that the same or similar functionality can also often be implemented, in whole or in part, directly in hardware logic, to provide the same or similar technical effects. Alternatively, or in addition to software implementation, the technical functionality described herein can be performed, at least in part, by one or more hardware logic components. For example, and without excluding other implementations, an embodiment may include hardware logic components 110, 128 such as Field-Programmable Gate Arrays (FPGAs), Application-Specific Integrated Circuits (ASICs), Application-Specific Standard Products (ASSPs), System-on-a-Chip components (SOCs), Complex Programmable Logic Devices (CPLDs), and similar components. Components of an embodiment may be grouped into interacting functional modules based on their inputs, outputs, and/or their technical effects, for example.

In addition to processors 110 (e.g., CPUs, ALUs, FPUs, TPUs and/or GPUs), memory/storage media 112, and displays 126, an operating environment may also include other hardware 128, such as batteries, buses, power supplies, wired and wireless network interface cards, for instance. The nouns "screen" and "display" are used interchangeably herein. A display 126 may include one or more touch screens, screens responsive to input from a pen or tablet, or screens which operate solely for output. In some embodiments, peripherals 106 such as human user I/O devices (screen, keyboard, mouse, tablet, microphone, speaker, motion sensor, etc.) will be present in operable communication with one or more processors 110 and memory.

In some embodiments, the system includes multiple computers connected by a wired and/or wireless network 108. Networking interface equipment 128 can provide access to networks 108, using network components such as a packet-switched network interface card, a wireless transceiver, or a telephone network interface, for example, which may be present in a given computer system. Virtualizations of networking interface equipment and other network components such as switches or routers or firewalls may also be present, e.g., in a software defined network or a sandboxed or other secure cloud computing environment. In some embodiments, one or more computers are partially or fully "air gapped" by reason of being disconnected or only intermittently connected to another networked device or remote cloud. In particular, bad or at-risk memory cell identification and management functionality could be installed on an air gapped system and then be updated periodically or on occasion using removable media. A given embodiment may also communicate technical data and/or technical instructions through direct memory access, removable nonvolatile storage media, or other information storage-retrieval and/or transmission approaches.

One of skill will appreciate that the foregoing aspects and other aspects presented herein under "Operating Environments" may form part of a given embodiment. This document's headings are not intended to provide a strict classification of features into embodiment and non-embodiment feature sets.

One or more items are shown in outline form in the Figures, or listed inside parentheses, to emphasize that they are not necessarily part of the illustrated operating environment or all embodiments, but may interoperate with items in the operating environment or some embodiments as discussed herein. It does not follow that items not in outline or parenthetical form are necessarily required, in any Figure or any embodiment. In particular, FIG. 1 is provided for convenience; inclusion of an item in FIG. 1 does not imply that the item, or the described use of the item, was known prior to the current innovations.

More about Devices

Figure 2:
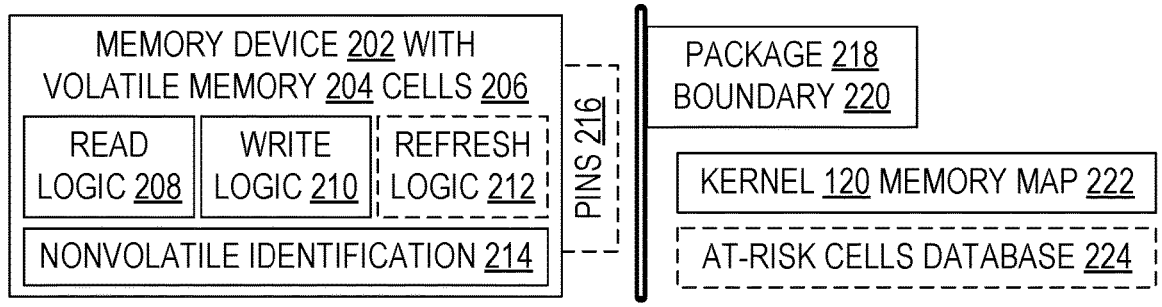
FIG. 2 is a block diagram illustrating a volatile memory device.

FIG. 2 illustrates a memory device 202 which has volatile memory 204. The volatile memory 204 includes memory cells 206, along with read logic 208 and write logic 210 for reading data values from the memory cells and writing data values to the memory cells. Depending on the kind of memory cells 206 that are present, the memory device may also contain refresh logic 212. For example, DRAM devices 202 would have refresh logic, while SRAM devices 202 would not.

In many cases, the memory device will include a plastic, ceramic, glass, or other package 218 around the logics, and the memory device will have pins 216 for electronic communication between the logics 208, 210 and external electronics such as buses. The pins 216 and an outer surface of the package 218 form a physical boundary 220 between the device's logics and other electronics and the ambient environment 100. The environment 100 may include, e.g., a data center server, a consumer or commercial vehicle, a robot, or another computing system 102 which contains electronics that include the memory device 202. However, embodiments described herein also include memory devices 202 which are not installed in a computing system 102.

In many cases, a computing system 102 in which a memory device is installed will have a software kernel 120, and the kernel will contain or manage or be guided by a memory map 222. The memory map specifies which portions of a physical or virtual memory address space are to be used for particular purposes during execution of the kernel 120 and other software 122, 124 in the computing system 102. Thus, the memory map 222 defines (implicitly or explicitly) memory pages or other blocks of volatile memory which are not for use.

FIG. 2 also shows a hypothetical at-risk cells database 224. This database contains identifications of bad cells 342 or at-risk cells 206 with corresponding die or device IDs. An entry in the database 224 might specify, for example, that the bits at locations B1, B7, and the row at location R12 of die number D6 failed to retain values when tested. The identifiers B1, B7, R12, D6 are placeholders in this example; in practice the identifiers used would likely be considerably longer and could have internal structure to specify data such as a batch number, plant number, and manufacture date. Placing such identification data in a database 224 would facilitate use of machine learning or statistical analyses or data mining operations that try to find patterns in the memory defect data.

However, considering the immense number of memory devices 202 used in a modern data center, and the number of bytes potentially needed to store defect data per die or per device, it will be clear to one of skill in the art that such a database 224 could be quite large. Even a relatively small data center has ten thousand servers (many data centers actually have fifty thousand or more servers), and each server likely has at least 16 GB of memory (many servers have more). Tracking merely one bad or at-risk memory byte per thousand would mean tracking over sixteen thousand locations per server. Multiplying that by ten thousand servers means tracking over 160 million locations in the database 224. Each database location entry would likely include at least ten bytes to specify the defect's specific location, e.g., in a specific row and column in a specific die from a specific wafer from a specific facility. Thus, even an approximate conservative estimate suggests that a database 224 would be several gigabytes in size. Using a database 224 to initialize or update the memory map 222 when the computing system 102 reboots would be slow, and the logistics of maintaining the database and getting the relevant database 224 content to the computing system would require additional expensive storage, compute, and network resources.

However, some embodiments described herein place nonvolatile identification 214 of bad or at-risk memory locations inside the same memory device 202 that has those particular bad or at-risk memory locations. Instead of downloading database 224 content, the kernel 120 can thus read the relevant identification 214 of bad or at-risk memory locations from the memory device 202 itself. There is no need to search a remote database 224 based on some memory device 202 serial number or some other device or die ID.

In some embodiments, the memory device 202 is self-documenting in the sense that it contains its own identification 214 of its own bad or at-risk memory locations.

Unlike the volatile memory 204 of the device 202, the identification 214 is nonvolatile. Unlike the result of traditional PPR procedures, the result of PPR adapted for use as taught herein is exported; the identification 214 of bad or at-risk memory locations can be read from the memory device 202.

Figure 3:
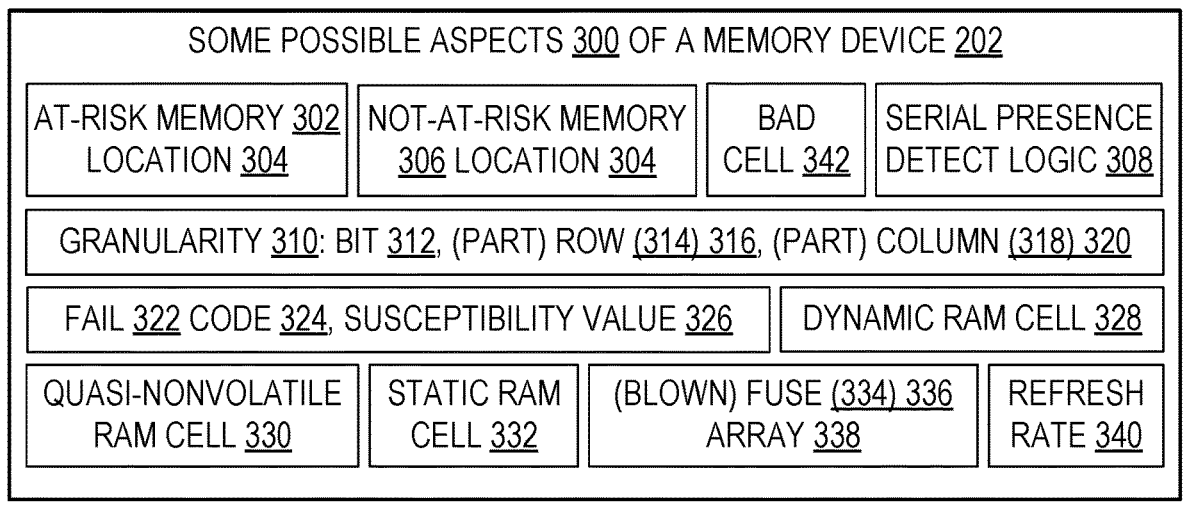
FIG. 3 is a block diagram illustrating aspects of some volatile memory devices.

FIG. 3 illustrates various aspects 300 of some memory devices 202. These aspects are discussed at various points herein, and additional details regarding them are provided in the discussion of a List of Reference Numerals later in this disclosure document.

Some embodiments use or provide a volatile memory device 202 that is configured to identify bad or at-risk memory locations 304 through a nonvolatile identification 214. As used herein, "bad" memory locations indicate volatile memory cells 206 that have failed reliability testing; some bad cells 342 may be usable if repaired (e.g., by PPR or RAP), but they are not presently usable as data storage. As used herein, "at-risk" memory 302 locations indicate volatile memory cells 206 that are presently usable as data storage but have a relatively high risk of future failure; the failure risk assessment may be based on test results for the die in question, test results for related dies, or other objective information.

In some embodiments, the volatile memory device 202 includes volatile memory cells 206 located in a package 218. In some embodiments, the volatile memory cells 206 are located outside a package, e.g., on a bare wafer or die. Some embodiments include a flip chip attached directly to a substrate or carrier, with an electrical connection made by a conductive bump, for example. Regardless of their location inside or outside a package, the volatile memory cells of interest have respective failure susceptibility values 326. The volatile memory cells include at least one bad memory 342 or at-risk memory 302 location 304 and include multiple other not-at-risk memory 306 locations 304, with the bad or at-risk memory location having a greater failure susceptibility value than the not-at-risk memory locations (more precisely, the cells 206 at the bad or at-risk memory location have a greater failure susceptibility value than the cells 206 at the not-at-risk memory locations).

In the illustrated embodiments, the volatile memory device 202 also includes read logic 208 in the package 218 in operable communication with the volatile memory cells, and write logic 210 in the package 218 in operable communication with the volatile memory cells. These embodiments also include a nonvolatile identification 214 in the package 218 of the bad or at-risk memory location 304. The identification 214 is readable from outside the device, e.g., outside the package.

In some embodiments, the memory device 202 includes refresh logic 212 in the package 218 in operable communication with the volatile memory cells 206. For example, the device 202 may include DRAM memory 204 cells or quasi-nonvolatile RAM memory 204 cells, with corresponding refresh logic 212. The refresh period for the device's memory may range from milliseconds to minutes or even longer, depending on the kind of memory 204 present in the device 202. The refresh period may also be infinite, meaning that no refresh is required to maintain data values stored in the memory 204. For instance, in some embodiments the volatile memory cells 206 include static random access memory cells.

In some embodiments, the memory device 202 includes a fuse array 338 in the package 218, and the identification 214 is implemented at least in part by a configuration of blown fuses 334 in the fuse array. Fuses 336 may be blown 414 using PPR tools and techniques which are adapted to create data 118 that is exportable from the package, as opposed to the typical PPR which is done to effect repairs or timing adjustments that are not per se exportable as specific data 118. Indeed, typical PPR and RAP are transparent to the device's environment 100.

In some embodiments, the memory device 202 includes a serial presence detect logic 308 in the package 218, and the identification 214 is implemented at least in part by serial presence detect (SPD) data 118 which configures the serial presence detect logic. This differs from a typical use of SPD logic which is to provide the firmware (e.g., BIOS, UEFI) of a computing system 102 with a memory device's size, data width, speed, and voltage, for example.

In some embodiments, one or more of a variety of granularities 310 can be used to identify bad cells or at-risk cells. The available granularities 310 may be finer than an OS page granularity or a fixed NAND bad block granularity. The smallest OS page granularity is typically 4 kilobytes. Some small block NAND flash devices have a block size of 32 pages, where a page has 512 normal bytes plus 16 spare bytes. By contrast, in some embodiments the identification 214 has at least one of the following granularities: bit 312, partial row 314, partial column 318, full row 316, or full column 320. A bank of memory 204 may contain, e.g., 4096 rows by 512 columns by 16 bits. Other granularities 310 that a given embodiment may implement include array and block.

A variety of identification 214 values and other data 118 can be stored in the memory device 202 about its at-risk memory 302. In some embodiments, in addition to location(s) 304 the identification 214 further includes a failure susceptibility value 326 of an at-risk memory location. In some, the identification 214 includes a test result 410, which may indicate the severity of the risk that this identified memory location will fail. In some embodiments, the identification 214 includes a fault code 324 indicating a test 406 which was failed by the memory cell(s) 206 located at the bad or at-risk memory location. Risk assessment in the kernel 120 may then consider which particular test 406 this identified memory location failed.

Other device or system embodiments are also described herein, either directly or derivable as device or system versions of described processes or configured media, informed by the discussion herein of computing hardware.

For example, some embodiments include a computing system 102 having installed memory devices 202 which are enhanced for automatic failure risk assessment as taught herein. The enhanced system includes a memory 112 with memory devices 202 containing respective nonvolatile at-risk volatile memory 302 identifications 214, and a processor 110 in operable communication with the memory 112. The enhanced system has a kernel 120, which may include firmware. The processor 110 and the memory 112 are configured to perform methods 400, methods 500, or methods having other steps described herein. In particular, the kernel 120 may read the identifications 214 during a power-on self-test (POST) or another system initialization, and then configure the memory map 222 to exclude 520 or 522 at-risk cells 206 even though they are not yet known to be bad cells.

Although specific architectural examples are shown in the Figures, an embodiment may depart from those examples. For instance, items shown in different Figures may be included together in an embodiment, items shown in a Figure may be omitted, functionality shown in different items may be combined into fewer items or into a single item, items may be renamed, or items may be connected differently to one another.

Examples are provided in this disclosure to help illustrate aspects of the technology, but the examples given within this document do not describe all of the possible embodiments. A given embodiment may include additional or different technical features, mechanisms, sequences, logic, physical structures, data structures, or functionalities for instance, and may otherwise depart from the examples provided herein.

Processes (a.k.a. Methods)

Figure 4:
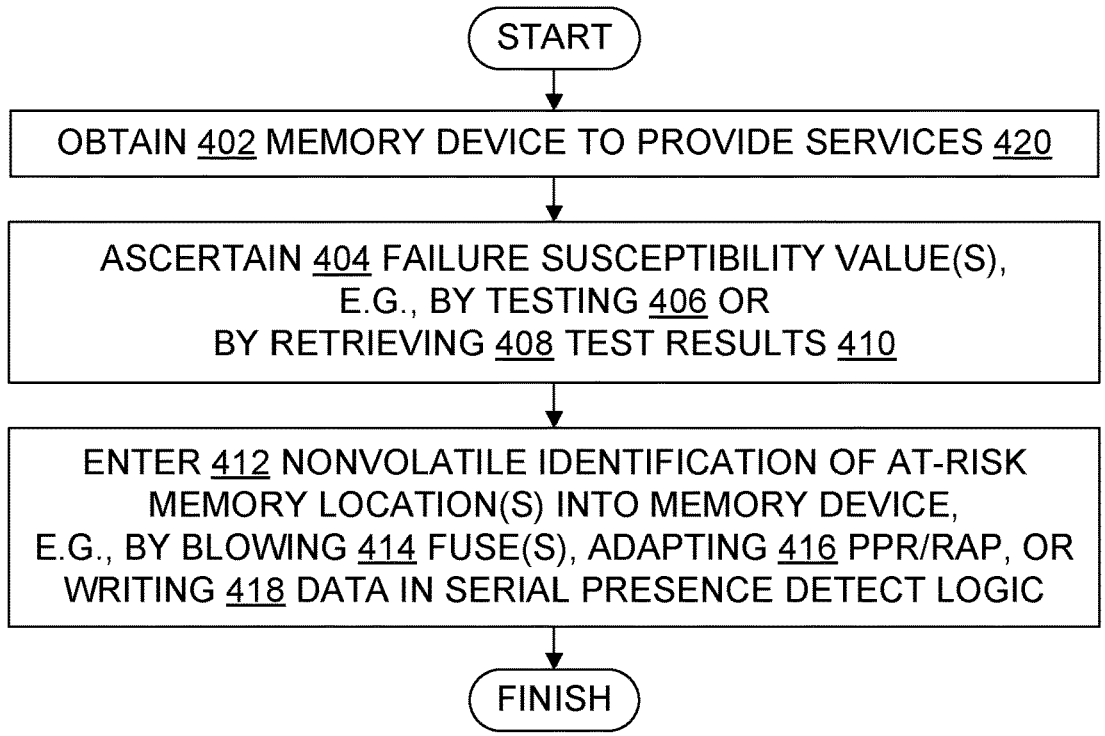
FIG. 4 is a flowchart illustrating steps in some methods for configuring a volatile memory device by entering in the device a nonvolatile identification of at-risk memory cells of the device.
Figure 5:
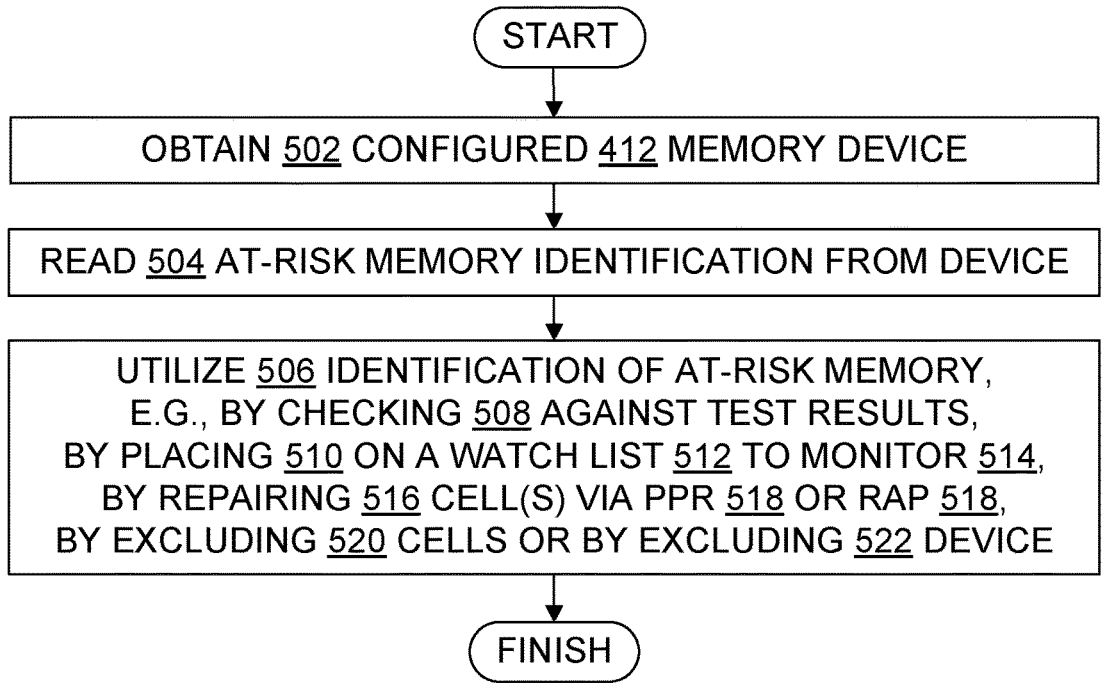
FIG. 5 is a flowchart illustrating steps in some methods for utilizing a volatile memory device which has been configured to hold a nonvolatile identification of at-risk memory cells of the device.

FIGS. 4 and 5 each illustrate a respective family of methods 400 and methods 500 that may be performed or assisted by an enhanced system or device, such as memory device 202 or a computing system 102 that contains or is electronically connected to a memory device 202, or another at-risk memory identification or management functionality-enhanced system as taught herein. Methods may also be referred to as "processes" in the legal sense of that word.

Technical processes shown in the Figures or otherwise disclosed will be performed automatically, e.g., by memory testing equipment 102 or by a server 102 during POST, unless otherwise indicated. Processes may also be performed in part automatically and in part manually to the extent action by a human administrator or other human person is implicated, e.g., in some embodiments a human administrator may specify which tests must be passed by at-risk memory to prevent exclusion of that at-risk memory from use. No process contemplated as innovative herein is entirely manual.

In a given embodiment zero or more illustrated steps of a process may be repeated, perhaps with different parameters or data to operate on. Steps in an embodiment may also be done in a different order than the top-to-bottom order that is laid out in FIGS. 4 and 5. Steps may be performed serially, in a partially overlapping manner, or fully in parallel. In particular, the order in which flowchart 400 or flowchart 500 individually numbered action items are traversed to indicate the steps performed during a process may vary from one performance of the process to another performance of the process. The flowchart traversal order may also vary from one process embodiment to another process embodiment. Steps may also be omitted, combined, renamed, regrouped, be performed on one or more machines, or otherwise depart from the illustrated flow, provided that the process performed is operable and conforms to at least one claim.

Some embodiments use or provide a device utilization method 500 to identify at-risk memory locations through a nonvolatile identification, including the following steps: obtaining 502 a memory device 202 which is configured to identify 214 at-risk memory locations, with the memory device including volatile memory cells 206 having respective failure susceptibility values 326. The volatile memory cells include at least one bad or at-risk memory location 304 and include multiple other not-at-risk memory 306 locations, with the bad or at-risk memory location having a greater failure susceptibility value than the not-at-risk memory locations.

The memory device 202 also includes a nonvolatile identification 214 of the bad or at-risk memory location. The method also includes reading 504 the identification from the memory device, and utilizing 506 the identification.

The utilization 506 may include, e.g., checking 508 whether the identification matches memory test results which were generated by testing the volatile memory cells of the memory device, placing 510 an at-risk memory location on a watch list identifying one or more volatile memory cells to be monitored for memory errors, repairing 516 a volatile memory cell that is located at an at-risk memory location, excluding 520 a volatile memory cell that is located at a bad or at-risk memory location from holding data within a computing system while allowing use of other cells 206 of the device, or excluding 522 the entire memory device from holding data within a computing system. If a system sees 514 that memory on a watch list 512 is weakening, e.g., starting to have correctable errors, or sees 514 that a related location such as one sharing circuitry has started failing, then the system can take action at that time to exclude 522 the monitored memory from further use.

In some embodiments, the method includes excluding 520 the volatile memory cell or excluding 522 the entire memory device from use, by mapping 222 memory 112 in a kernel 120.

In some embodiments, the method further includes entering 412 identification data 214 into the memory device 202. Entering 412 the identification to the memory device may be done by initially writing it or by editing it after the initial write. Entering 412 identification data 214 may be done, e.g., by blowing 414 one or more fuses in the fuse array 338 of the memory device, or by writing 418 data to the memory device's SPD 308, for example. As used herein, "fuse" includes fuses or antifuses or both, and includes any programmable element of a memory device that can be configured by way of a short or by way of an open.

Information 214 could also be written to a flash storage which is added to a memory component 112, but this has the disadvantage of requiring additional space on the component. That is, one of skill will acknowledge that one benefit of entering identification 214 by blowing 414 fuses or writing 418 identification data 214 in the SPD is that no additional real estate is needed. The existing logic may be repurposed instead in some embodiments, as taught herein.

Another advantage of some embodiments is that they are backward compatible by default. If a memory device 202 contains an at-risk memory identification 214 but the computing system kernel 120 does not read 504 that identification 214, then the configured memory device 202 will still function in the computing system as if it were traditional non-configured memory 112.

Some embodiments adapt PPR technology to embed 412 information 214 instead of, or in addition to, using PPR technology to make internal chip timing adjustments to compensate for process variability per die, or to enable spare cells, or route signals around bad cells 342. In some embodiments, entering 412 includes employing an adapted 416 post package repair procedure 518 or an adapted 416 repair after packaging procedure 518 to enter the identification into the memory device. Adaptation 416 may include blowing fuses whose configuration can then be read 504 and interpreted as locations 304 or other identification 214 data. In some embodiments, reading 504 includes employing DQ pins 216 of the memory device to read the identification; in some embodiments, one or more other pins are repurposed to permit reading the identification 214. Identification read pins may also be added to a device 202 specifically to support reading identifications 214.

In some embodiments, the memory device 202 serves 420 as the most authoritative source of the identification of at-risk memory 302 cells of the memory device 202. Accordingly, an external database 224 of at-risk cell location identification 214 data is not employed, and may not even exist. In particular, in some embodiments the memory device 202 is installed in a computing device 102, and the method avoids reliance on any database 224 which contains identifications 214 of at-risk memory locations 304 of memory devices 202 that are not installed in the computing device 102.

Some embodiments use or provide a device configuration method 400 to identify at-risk memory locations through a nonvolatile identification, including obtaining 402 a memory device 112. The memory device 112 includes volatile memory 204 cells 206 but does not yet not necessarily have any identification 214 data therein. The method 400 also includes ascertaining 404 respective failure susceptibility values for the volatile memory cells, the volatile memory cells thereby including at least one at-risk memory location and including multiple other not-at-risk memory locations, with the at-risk memory location having a greater failure susceptibility value than the not-at-risk memory locations. The method 400 also includes entering 412 a nonvolatile identification 214 of the at-risk memory location into the memory device, thereby configuring 412 the memory device 202 to identify the at-risk memory location.

In some embodiments, entering 412 includes blowing 414 a fuse in a fuse array of the memory device. This may be done, for example, by a memory manufacturer or other memory vendor, or by sophisticated memory purchasers. In some embodiments, entering 412 includes employing an adapted 416 PPR or RAP procedure 518 to enter the identification into the memory device.

Vendors or others may perform quality assurance to make sure the fuses got blown correctly, or to make sure the correct at-risk info was written to the SPD. Thus, some method 400 embodiments include reading 504 the identification 214 from the memory device 202, and checking 508 whether the identification read matches memory test results generated by testing 406 the volatile memory cells of the memory device.

Memory vendors or others may enter 412 identifications 214 that have different granularities 310, e.g., to indicate there's a risky bit 312 at location X and also a risky row 316 at location Y. In particular, in some embodiments the method includes entering 412 multiple nonvolatile at-risk memory location identifications 214 of different granularities 310 into the memory device 202.

Configured Storage Media

Some embodiments include a configured computer-readable storage medium 112. Storage medium 112 may include disks (magnetic, optical, or otherwise), RAM, EEPROMS or other ROMs, and/or other configurable memory, including in particular computer-readable storage media (which are not mere propagated signals). The storage medium which is configured may be in particular a removable storage medium 114 such as a CD, DVD, or flash memory. A general-purpose memory, which may be removable or not, and may be volatile or not, can be configured into an embodiment using items such as kernel firmware or other software that reads 504 at-risk memory identifications 214 from configured 400 memory devices 202, or software 122 that controls adapted PPR technology or SPD writers to enter 412 identification data 214 into a memory device 112, in the form of data 118 and instructions 116, read from a removable storage medium 114 and/or another source such as a network connection, to form a configured storage medium. The configured storage medium 112 is capable of causing a computer system 102 to perform technical process steps for at-risk memory location 304 identification 214 and management 506, as disclosed herein. The Figures thus help illustrate configured storage media embodiments and process (a.k.a. method) embodiments, as well as device, system, and process embodiments.

In particular, any of the process steps illustrated in FIG. 4 or 5, or otherwise taught herein, may be used to help configure a storage medium to form a configured storage medium embodiment.

Some embodiments use or provide a computer-readable storage medium 112, 114 configured with data 118 and instructions 116 which upon execution by at least one processor 110 cause a computing system to perform a method 400, a method 500, or another method taught herein.

Additional Examples and Observations

Some embodiments use or provide a memory reliability enhancement method which includes identifying 404 an at-risk area 302 of a digital memory 112 of a memory component 202, the at-risk area having at least one address 304, and programming 414 the address 304, 214 into a fuse array 338 of the memory component 202.

Some embodiments use or provide a memory reliability enhancement method which includes getting 504 from a programmed fuse array 338 at least one address 304, 214 which identifies an at-risk area 302 of a digital memory 112 of a memory component 202, and configuring 520 or 522 a kernel 120 data structure 222 of a computing system 102 to avoid use of the at-risk area during subsequent operation of the computing system.

Some embodiments utilize the anti-fuses 336 that sit on each individual DRAM component 112 to hold the row 316 and column 320 information 214 for the areas (at-risk 302 or bad 342 or both) of the memory 112 the kernel 120 should offline 520 or 522 in order to decrease uncorrectable errors. These fuses 336 are persistent and can be read upon initialization.

More broadly, one of skill will acknowledge that some defects 322 in memory are known to have a higher chance of leading to an uncorrectable error kind of memory failure over time. With the benefit of teachings provided herein, memory vendors can blow 414 information 214 into that fuse array, such that the fuse array holds the information of what rows and columns are boundaries (a.k.a. "bookends") of repaired out fails. The kernel 120 can use this information 214 to improve long term quality of the memory 112 in the field. This approach is flexible in that it allows each memory vendor to ask the kernel 120 to map out extra elements that are particular to their product and process node. In particular, information 214 is not necessarily limited to locations 304; it may also hold detailed memory test data 118 such as what tests were failed, what test scores were given, when the testing occurred, who performed the test, and so on.

Some embodiments allow for customers to accept less than perfect memory components, e.g., those exhibiting bit forgiveness. A data center, server vendor, or other memory customer may buy product 112 with some known bad locations 342, 304 and map those bad areas 342 out with the kernel. Accepting memory with known defects and assuming some of the responsibility for avoiding those defective areas could allow customers to buy such memory at a discounted price. This would be beneficial both the customers. It would also benefit memory vendors, who could sell such memory instead of discarding it. Even if some portion of discarded memory could be recycled, the memory vendor likely would realize more revenue by selling the defective but configured 412 memory 202 than by recycling it.

One of skill in the art will acknowledge that sophisticated memory customers such as server vendors and data centers have ways to run analysis and either repair out bad memory locations using existing PPR paths or to offline them. Some embodiments described herein adapt the use of PPR circuitry and control to enable blowing 414 in permanently the address locations 304 for the parts of the memory of a specific DRAM module and component that the customer policy dictates should be offlined by an OS or other kernel. RAP tools may be similarly adapted 416. An embodiment may add into an initialization sequence the ability for those fuses to be read out of the DQ lines. As noted, the fuses indicate the locations of the elements each DRAM specifies to have the 0/S offline. This allows each individual DRAM and module to communicate that info about itself to the memory controllers and OS. Since each individual DRAM could hold the instructions for what elements to offline, vendors could use this functionality, and so could customers. In particular, applying teachings herein may decrease the downtime that is due to memory related uncorrectable errors.

One aspect of many embodiments is the close physical bond between the at-risk memory location identification 214 and the at-risk memory 302 itself. Similarly, the identification 214 of bad memory 342 is physically bound to the bad memory itself. This may be implemented, e.g., by having both the identification 214 and the identified memory in the same package, or on the same chip, or on the same printed circuit board, or on the same DIMM.

One of skill will recognize that not every part of this disclosure, or any particular details therein, are necessarily required to satisfy legal criteria such as enablement, written description, or best mode. Also, embodiments are not limited to the particular volatile memory 204 technologies, tools, identifiers, fields, data structures, functions, or other implementation choices. Any apparent conflict with any other patent disclosure, even from the owner of the present innovations, has no role in interpreting the claims presented in this patent disclosure.

Any of these combinations of code, data structures, logic, components, communications, and/or their functional equivalents may also be combined with any of the systems and their variations described above. A process may include any steps described herein in any subset or combination or sequence which is operable. Each variant may occur alone, or in combination with any one or more of the other variants. Each variant may occur with any of the processes and each process may be combined with any one or more of the other processes. Each process or combination of processes, including variants, may be combined with any of the configured storage medium combinations and variants described above.

With this understanding, which pertains to all parts of the present disclosure, some additional examples and observations are offered below. For convenience, this additional support material appears under various headings. Nonetheless, it is all intended to be understood as an integrated and integral part of the present disclosure's discussion of the contemplated embodiments.

Technical Character

The technical character of embodiments described herein will be apparent to one of ordinary skill in the art, and will also be apparent in several ways to a wide range of attentive readers. Some embodiments address technical activities such as configuring memory devices through PPR or SPD adaptations, and excluding at-risk memory 202 from use in a computing system 102, which are each activities deeply rooted in computing technology. Some of the technical mechanisms discussed include, e.g., blown 414 fuses 334, written 418 SPD logic 308, at-risk memory watch lists 512, and memory tests 406. Some of the technical effects discussed include, e.g., providing memory devices 112 with self-documentation in the form of embedded nonvolatile identifications 214 of their at-risk cell locations 304, avoiding use of external at-risk cell databases 224, and increased yields and lower memory costs by providing an efficient and useful communication path for memory vendors to inform sophisticated memory purchasers about unrepaired currently working but at-risk memory locations. Thus, purely mental processes are clearly excluded. Other advantages based on the technical characteristics of the teachings will also be apparent to one of skill from the description provided.

Some embodiments described herein may be viewed by some people in a broader context. For instance, concepts such as failure, location, repair, risk, and storage may be deemed relevant to a particular embodiment. However, it does not follow from the availability of a broad context that exclusive rights are being sought herein for abstract ideas; they are not. Rather, the present disclosure is focused on providing appropriately specific embodiments whose technical effects fully or partially solve particular technical problems, such as how to automatically communicate detailed memory test results instead of discarding dies that contain more bad or at-risk cells than familiar PPR or familiar RAP can repair. Other configured storage media, systems, and processes involving failure, location, repair, risk, or storage are outside the present scope. Accordingly, vagueness, mere abstractness, lack of technical character, and accompanying proof problems are also avoided under a proper understanding of the present disclosure.

ACRONYMS, ABBREVIATIONS, NAMES, AND SYMBOLS

Some acronyms, abbreviations, names, and symbols are defined below. Others are defined elsewhere herein, or do not require definition here in order to be understood by one of skill.

ALU: arithmetic and logic unit
BIOS: basic input/output system
CD: compact disc
CPU: central processing unit
DIMM: dual inline mounted module
DQ pins: Data I/O pins; pins may also be called "lines"
DRAM: dynamic RAM
DVD: digital versatile disk or digital video disc
FPGA: field-programmable gate array
FPU: floating point processing unit
GPU: graphical processing unit
ID: identification or identity
I/O: input output
LAN: local area network
OS: operating system
PPR: post package repair
POST: power-on self-test
RAM: random access memory
RAP: repair after packaging
ROM: read only memory
SPD: serial presence detect
SRAM: static RAM
TPU: tensor processing unit
UEFI: Unified Extensible Firmware Interface
WAN: wide area network Some Additional Terminology Reference is made herein to exemplary embodiments such as those illustrated in the drawings, and specific language is used herein to describe the same. But alterations and further modifications of the features illustrated herein, and additional technical applications of the abstract principles illustrated by particular embodiments herein, which would occur to one skilled in the relevant art(s) and having possession of this disclosure, should be considered within the scope of the claims.

The meaning of terms is clarified in this disclosure, so the claims should be read with careful attention to these clarifications. Specific examples are given, but those of skill in the relevant art(s) will understand that other examples may also fall within the meaning of the terms used, and within the scope of one or more claims. Terms do not necessarily have the same meaning here that they have in general usage (particularly in non-technical usage), or in the usage of a particular industry, or in a particular dictionary or set of dictionaries. Reference numerals may be used with various phrasings, to help show the breadth of a term. Omission of a reference numeral from a given piece of text does not necessarily mean that the content of a Figure is not being discussed by the text. The inventors assert and exercise the right to specific and chosen lexicography. Quoted terms are being defined explicitly, but a term may also be defined implicitly without using quotation marks. Terms may be defined, either explicitly or implicitly, here in the Detailed Description and/or elsewhere in the application file.

As used herein, a "computer system" (a.k.a. "computing system") may include, for example, one or more servers, motherboards, processing nodes, laptops, tablets, personal computers (portable or not), personal digital assistants, smartphones, smartwatches, smartbands, cell or mobile phones, other mobile devices having at least a processor and a memory, video game systems, augmented reality systems, holographic projection systems, televisions, wearable computing systems, and/or other device(s) providing one or more processors controlled at least in part by instructions. The instructions may be in the form of firmware or other software in memory and/or specialized circuitry.

A "processor" is a processing unit, such as a core in a simultaneous multithreading implementation, CPU, GPU, or TPU. A processor includes hardware. A given chip may hold one or more processors. Processors may be general purpose, or they may be tailored for specific uses such as vector processing, graphics processing, signal processing, floating-point arithmetic processing, encryption, I/O processing, machine learning, and so on.

"Kernels" include operating systems, hypervisors, virtual machines, BIOS or UEFI code, and similar hardware interface software.

As used herein, "include" allows additional elements (i.e., includes means comprises) unless otherwise stated.

"Optimize" means to improve, not necessarily to perfect. For example, it may be possible to make further improvements in a program or an algorithm which has been optimized.

"Process" is sometimes used herein as a term of the computing science arts, and in that technical sense encompasses computational resource users, which may also include or be referred to as coroutines, threads, tasks, interrupt handlers, application processes, kernel processes, procedures, or object methods, for example. As a practical matter, a "process" is the computational entity identified by system utilities such as Windows® Task Manager, Linux® ps, or similar utilities in other operating system environments (marks of Microsoft Corporation, Linus Torvalds, respectively). "Process" is also used herein as a patent law term of art, e.g., in describing a process claim as opposed to a system claim or an article of manufacture (configured storage medium) claim. Similarly, "method" is used herein at times as a technical term in the computing science arts (a kind of "routine") and also as a patent law term of art (a "process"). "Process" and "method" in the patent law sense are used interchangeably herein. Those of skill will understand which meaning is intended in a particular instance, and will also understand that a given claimed process or method (in the patent law sense) may sometimes be implemented using one or more processes or methods (in the computing science sense).

"Automatically" means by use of automation (e.g., general purpose computing hardware configured by software for specific operations and technical effects discussed herein), as opposed to without automation. In particular, steps performed "automatically" are not performed by hand on paper or in a person's mind, although they may be initiated by a human person or guided interactively by a human person. Automatic steps are performed with a machine in order to obtain one or more technical effects that would not be realized without the technical interactions thus provided. Steps performed automatically are presumed to include at least one operation performed proactively. Computational results are faster, broader, deeper, more accurate, more consistent, more comprehensive, and/or otherwise provide technical effects that are beyond the scope of human performance alone. "Computationally" and "automatically" are used interchangeably herein. Neither "automatically" nor "computationally" necessarily means "immediately".

One of skill understands that technical effects are the presumptive purpose of a technical embodiment. The mere fact that calculation is involved in an embodiment, for example, and that some calculations can also be performed without technical components (e.g., by paper and pencil, or even as mental steps) does not remove the presence of the technical effects or alter the concrete and technical nature of the embodiment. At-risk memory management operations such as entering 412 identifications, writing 418 data in SPD, excluding 520, 522 memory 204 from usage, and many other operations discussed herein, are understood to be inherently digital. A human mind cannot interface directly with a CPU or other processor, or with RAM or other digital storage, to read and write the necessary data to perform the memory management steps taught herein. This would all be well understood by persons of skill in the art in view of the present disclosure.

"Proactively" means without a direct request from a user. Indeed, a user may not even realize that a proactive step by an embodiment was possible until a result of the step has been presented to the user. Except as otherwise stated, any computational and/or automatic step described herein may also be done proactively.

Throughout this document, use of the optional plural "(s)", "(es)", or "(ies)" means that one or more of the indicated features is present. For example, "processor(s)" means "one or more processors" or equivalently "at least one processor".

For the purposes of United States law and practice, use of the word "step" herein, in the claims or elsewhere, is not intended to invoke means-plus-function, step-plus-function, or 35 United State Code Section 112 Sixth Paragraph/ Section 112(f) claim interpretation. Any presumption to that effect is hereby explicitly rebutted.

For the purposes of United States law and practice, the claims are not intended to invoke means-plus-function interpretation unless they use the phrase "means for". Claim language intended to be interpreted as means-plus-function language, if any, will expressly recite that intention by using the phrase "means for". When means-plus-function interpretation applies, whether by use of "means for" and/or by a court's legal construction of claim language, the means recited in the specification for a given noun or a given verb should be understood to be linked to the claim language and linked together herein by virtue of any of the following: appearance within the same block in a block diagram of the figures, denotation by the same or a similar name, denotation by the same reference numeral, a functional relationship depicted in any of the figures, a functional relationship noted in the present disclosure's text. For example, if a claim limitation recited a "zac widget" and that claim limitation became subject to means-plus-function interpretation, then at a minimum all structures identified anywhere in the specification in any figure block, paragraph, or example mentioning "zac widget", or tied together by any reference numeral assigned to a zac widget, or disclosed as having a functional relationship with the structure or operation of a zac widget, would be deemed part of the structures identified in the application for zac widgets and would help define the set of equivalents for zac widget structures.

One of skill will recognize that this innovation disclosure discusses various data values and data structures, and recognize that such items reside in a memory (RAM, disk, etc.), thereby configuring the memory. One of skill will also recognize that this innovation disclosure discusses various algorithmic steps which are to be embodied in executable code in a given implementation, and that such code also resides in memory, and that it effectively configures any general purpose processor which executes it, thereby transforming it from a general purpose processor to a special-purpose processor which is functionally special-purpose hardware.

Accordingly, one of skill would not make the mistake of treating as non-overlapping items (a) a memory recited in a claim, and (b) a data structure or data value or code recited in the claim. Data structures and data values and code are understood to reside in memory, even when a claim does not explicitly recite that residency for each and every data structure or data value or piece of code mentioned. Accordingly, explicit recitals of such residency are not required. However, they are also not prohibited, and one or two select recitals may be present for emphasis, without thereby excluding all the other data values and data structures and code from residency. Likewise, code functionality recited in a claim is understood to configure a processor, regardless of whether that configuring quality is explicitly recited in the claim.

Throughout this document, unless expressly stated otherwise any reference to a step in a process presumes that the step may be performed directly by a party of interest and/or performed indirectly by the party through intervening mechanisms and/or intervening entities, and still lie within the scope of the step. That is, direct performance of the step by the party of interest is not required unless direct performance is an expressly stated requirement. For example, a step involving action by a party of interest such as adapting, ascertaining, blowing, checking, entering, excluding, listing, monitoring, obtaining, placing, putting, reading, refreshing, repairing, retrieving, testing, utilizing, writing (and adapts, adapted, ascertains, ascertained, etc.) with regard to a destination or other subject may involve intervening action such as the foregoing or forwarding, copying, uploading, downloading, encoding, decoding, compressing, decompressing, encrypting, decrypting, authenticating, invoking, and so on by some other party, including any action recited in this document, yet still be understood as being performed directly by the party of interest.

Whenever reference is made to data or instructions, it is understood that these items configure a computer-readable memory and/or computer-readable storage medium, thereby transforming it to a particular article, as opposed to simply existing on paper, in a person's mind, or as a mere signal being propagated on a wire, for example. For the purposes of patent protection in the United States, a memory or other computer-readable storage medium is not a propagating signal or a carrier wave or mere energy outside the scope of patentable subject matter under United States Patent and Trademark Office (USPTO) interpretation of the In re Nuijten case. No claim covers a signal per se or mere energy in the United States, and any claim interpretation that asserts otherwise in view of the present disclosure is unreasonable on its face. Unless expressly stated otherwise in a claim granted outside the United States, a claim does not cover a signal per se or mere energy.

Moreover, notwithstanding anything apparently to the contrary elsewhere herein, a clear distinction is to be understood between (a) computer readable storage media and computer readable memory, on the one hand, and (b) transmission media, also referred to as signal media, on the other hand. A transmission medium is a propagating signal or a carrier wave computer readable medium. By contrast, computer readable storage media and computer readable memory are not propagating signal or carrier wave computer readable media. Unless expressly stated otherwise in the claim, "computer readable medium" means a computer readable storage medium, not a propagating signal per se and not mere energy.

An "embodiment" herein is an example. The term "embodiment" is not interchangeable with "the invention". Embodiments may freely share or borrow aspects to create other embodiments (provided the result is operable), even if a resulting combination of aspects is not explicitly described per se herein. Requiring each and every permitted combination to be explicitly and individually described is unnecessary for one of skill in the art, and would be contrary to policies which recognize that patent specifications are written for readers who are skilled in the art. Formal combinatorial calculations and informal common intuition regarding the number of possible combinations arising from even a small number of combinable features will also indicate that a large number of aspect combinations exist for the aspects described herein. Accordingly, requiring an explicit recitation of each and every combination would be contrary to policies calling for patent specifications to be concise and for readers to be knowledgeable in the technical fields concerned.

LIST OF REFERENCE NUMERALS

The following list is provided for convenience and in support of the drawing figures and as part of the text of the specification, which describe innovations by reference to multiple items. Items not listed here may nonetheless be part of a given embodiment. For better legibility of the text, a given reference number is recited near some, but not all, recitations of the referenced item in the text. The same reference number may be used with reference to different examples or different instances of a given item. The list of reference numerals is:

100 operating environment, also referred to as computing environment
102 computer system, also referred to as computational system or computing system
104 users
106 peripherals
108 network generally, including, e.g., LANs, WANs, software defined networks, clouds, and other wired or wireless networks
110 processor
112 computer-readable storage medium, e.g., RAM, hard disks
114 removable configured computer-readable storage medium
116 instructions executable with processor; may be on removable storage media or in other memory (volatile or nonvolatile or both)
118 data
120 kernel(s), e.g., operating system(s), BIOS, UEFI, device drivers
122 tools, e.g., anti-virus software, firewalls, packet sniffer software, intrusion detection systems, intrusion prevention systems, other cybersecurity tools, debuggers, profilers, compilers, interpreters, decompilers, assemblers, disassemblers, source code editors, auto-completion software, simulators, fuzzers, repository access tools, version control tools, optimizers, collaboration tools, other software development tools and tool suites (including, e.g., integrated development environments), hardware development tools and tool suites, diagnostics, PPR tools, SPD readers, SPD writers, and so on
124 applications, e.g., word processors, web browsers, spreadsheets, games, email tools, commands
126 display screens, also referred to as "displays"
128 computing hardware not otherwise associated with a reference number 106, 108, 110, 112, 114
202 memory device configured with nonvolatile identification 214; a device 202 is thus a particular kind of memory device 112; a device 202 has one or more packages 218 physically connected together, e.g., a DIMM is a device 202 having multiple packages mounted on the same board
204 volatile memory
206 memory cell
208 read logic in a memory device 112; logic in general may also be referred to a "circuitry" or "signal paths" or "components" or "electronics"
210 write logic in a memory device 112
212 refresh logic in a memory device 112
214 nonvolatile identification of bad or at-risk memory locations of the same device that contains the identification; an identification 214 may also include other data 118 such as error codes 324, test IDs, tester ID, testing timestamp, range of fails, and so on
216 pins; may also be called "lines"
218 package containing one or more dies with memory cells
220 boundary of memory device
222 memory map used by kernel; numeral 222 also refers to the activity of memory mapping
224 database of at-risk memory information; this database is external to the memory devices whose at-risk memory information is stored in the database
300 aspect of a memory device
302 at-risk memory
304 location of one or more memory cells; a location has an explicit or implicit granularity 310
306 memory which is not known from testing to be at-risk and also not known to be bad
308 serial presence detect logic; may also be referred to as "SPD logic" or as "SPD"
310 memory cell(s) location granularity, e.g., the number or arrangement of memory cells that a location identifies relative to other memory cells in a memory device
312 bit granularity; also refers to a bit; a bit may be implemented using one or more memory cells 206
314 partial row granularity; also refers to a partial row of cells
316 full row granularity; also refers to a full row of cells
318 partial column granularity; also refers to a partial column of cells
320 full column granularity; also refers to a full column of cells
322 memory failure; numeral 322 also refers to memory defects
324 error code providing some detail regarding memory failure
326 memory failure susceptibility value, e.g., a numeric measure of a risk that a memory cell will fail within a specified time period or a specified temperature range or a specified number of reads/writes; may be implemented as a memory test result score
328 DRAM cell, namely, a cell 206 that requires refresh at a refresh rate of at least once per second
330 quasi-nonvolatile memory cell, namely, a cell 206 that requires refresh but at a refresh rate greater than once per second; some quasi-nonvolatile memory refresh rates are measured in seconds or even larger units
332 SRAM cell
334 blown fuse
336 fuse in fuse array; also refers to antifuses (a.k.a. "anti-fuses")
338 array of fuses
340 refresh rate for DRAM or quasi-nonvolatile memory
342 bad memory cell, that is, a memory cell which is known unreliable
400 flowchart; 400 also refers to memory device configuration methods illustrated by or consistent with the FIG. 4 flowchart
402 obtain a memory device 112, e.g., by purchasing one, pulling one from stock, or pulling one from a computing system
404 ascertain failure susceptibility values for cell(s) of an obtained device
406 test cell(s) of a memory device; this may include familiar tests performed by memory vendors, or other tests of a memory device's reliability or prospective reliability; numeral 406 refers to test as a verb and as a noun
408 retrieve test results 410, e.g., from a testing device or from a file or other digital artifact containing test results
410 results of testing 406
412 enter identification 214 data about a memory device into that memory device; may also be referred to as "embedding" or "writing" the identification data or as "configuring" the device with the identification data 414 blow a fuse, e.g., by shorting a gate and transistor, applying a high voltage, applying a high-density current, or applying a laser to melt or cut material; may also be referred to as an example of "programming" a device or a circuit, or be referred to as an example of "one-time programming" of a memory device; numeral 414 also refers to programming antifuses 416 adapt PPR technology in at least one of the following respects: (a) make a post package physical change in a memory device to embed 412 information 214 in the memory device instead of making a physical change to alter timing inside the memory device or to bring a spare cell 206 into service or to remove a bad cell from service, or (b) make a post package physical change in a memory device which is not functionally transparent to a kernel but instead makes information 214 available to be read 504 from the memory device by the kernel 418 write information 214 into an SPD; writing 418 may also be referred to as "putting" the information 214 in the SPD or as "configuring" the SPD with the information 214, for example 420 serve a purpose, e.g., serve as a source of data 500 flowchart; 500 also refers to memory device utilization methods illustrated by or consistent with the FIG. 5 flowchart 502 obtain a memory device 202 which has been configured 412 with information 214, e.g., by purchasing one, pulling one from stock, or pulling one from a computing system 504 read information 214 from a configured memory device 202, e.g., by PPR readout or SPD readout 506 utilize information 214 to improve the functionality of a computing system 102 or as an improved tool for managing memory devices 112

508 check information 214 by comparing it to memory test results 410

510 place a memory location 304 on a watch list 512 memory location watch list, e.g., a list, table, array, record, file, or other digital artifact whose contents identify one or more memory locations 304

514 monitor memory, e.g., by interleaving extra memory tests into usage of the memory, or by running lower priority executions in case the memory fails 516 repair memory cell(s), e.g., using familiar PPR technology to route signals around bad cells and use previously spare cells in their stead; this may be referred to as "switching out" memory with a redundant element 518 post package repair (PPR) or repair after packaging (RAP); unless reference is made to "adapted" PPR or to identification 214, PPR refers to PPR technology (tools, techniques) as practiced without the benefit of the teachings presented herein; likewise, unless reference is made to "adapted" RAP or to identification 214, RAP refers to RAP technology (tools, techniques) as practiced without the benefit of the teachings presented herein; familiar PPR or RAP may also be referred to as "self-repair"

520 exclude one or more cells of a memory device 202 from use to support software execution while still allowing the use of other cells 306 of that memory device; excluding may also be referred to as "offlining"

522 exclude all cells of a memory device 202 from use to support software execution

CONCLUSION

In short, the teachings herein provide a variety of memory management enhancement functionalities. In some embodiments, a volatile memory device 112 is configured 412 to self-document by identifying 214 its own bad memory 342 or at-risk memory 302 locations 304. This embedding 412 provides a configured memory device 202 which has the nonvolatile identification 214 embedded in itself. This can be accomplished without using additional board real estate, by repurposing 416 PPR or SPD 308 technology, or both. The identification 214 of bad or at-risk memory is readable 504 by firmware 120 outside the device 202. The device 202 includes volatile memory cells 206 that have respective failure susceptibility values 326, some of which indicate bad 342 or at-risk 302 memory cells. The memory device 202 also includes read logic 208 and write logic 210, and may include refresh logic 212. The identification 214 may be embedded 412 in the device 202 by blowing 414 fuses 336 in an adaptation 416 of post package repair activity 518 or an adaptation 416 of repair after packaging activity 518, or by writing 418 identification 214 data 118 in a serial presence detect logic 308, for example. The configured memory device 202 may efficiently, persistently, and reliably provide detailed memory test results 410 regarding itself, thereby allowing customers to accept and safely use memory 112 that would otherwise have been discarded to prevent software crashes.

Although Microsoft technology is used in some motivating examples, the teachings herein are not limited to use in technology supplied or administered by Microsoft. Under a suitable license, for example, the present teachings could be embodied in software or services provided by other cloud service providers.

Although particular embodiments are expressly illustrated and described herein as processes, as configured storage media, as devices, or as systems, it will be appreciated that discussion of one type of embodiment also generally extends to other embodiment types. For instance, the descriptions of processes in connection with FIGS. 4 and 5 also help describe configured storage media, and help describe the technical effects and operation of devices, systems and manufactures like those discussed in connection with other Figures. It does not follow that limitations from one embodiment are necessarily read into another. In particular, processes are not necessarily limited to the data structures and arrangements presented while discussing devices, systems, or manufactures such as configured memories.

Those of skill will understand that implementation details may pertain to specific examples, such as specific memory technologies, yields, refresh rates, granularities, or nonvolatile information embedding technologies, and thus need not appear in every embodiment. Nonetheless, although they are not necessarily required to be present here, such details may help some readers by providing context and/or may illustrate a few of the many possible implementations of the technology discussed herein.

With due attention to the items provided herein, including technical processes, technical effects, technical mechanisms, and technical details which are illustrative but not comprehensive of all claimed or claimable embodiments, one of skill will understand that the present disclosure and the embodiments described herein are not directed to subject matter outside the technical arts, or to any idea of itself such as a principal or original cause or motive, or to a mere result per se, or to a mental process or mental steps, or to a business method or prevalent economic practice, or to a mere method of organizing human activities, or to a law of nature per se, or to a naturally occurring thing or process, or to a living thing or part of a living thing, or to a mathematical formula per se, or to isolated software per se, or to a merely conventional computer, or to anything wholly imperceptible or any abstract idea per se, or to insignificant post-solution activities, or to any method implemented entirely on an unspecified apparatus, or to any method that fails to produce results that are useful and concrete, or to any preemption of all fields of usage, or to any other subject matter which is ineligible for patent protection under the laws of the jurisdiction in which such protection is sought or is being licensed or enforced.

Reference herein to an embodiment having some feature X and reference elsewhere herein to an embodiment having some feature Y does not exclude from this disclosure embodiments which have both feature X and feature Y, unless such exclusion is expressly stated herein. All possible negative claim limitations are within the scope of this disclosure, in the sense that any feature which is stated to be part of an embodiment may also be expressly removed from inclusion in another embodiment, even if that specific exclusion is not given in any example herein. The term "embodiment" is merely used herein as a more convenient form of "process, system, device, article of manufacture, configured computer readable storage medium, and/or other example of the teachings herein as applied in a manner consistent with applicable law." Accordingly, a given "embodiment" may include any combination of features disclosed herein, provided the embodiment is consistent with at least one claim.

Not every item shown in the Figures need be present in every embodiment. Conversely, an embodiment may contain item(s) not shown expressly in the Figures. Although some possibilities are illustrated here in text and drawings by specific examples, embodiments may depart from these examples. For instance, specific technical effects or technical features of an example may be omitted, renamed, grouped differently, repeated, instantiated in hardware and/or software differently, or be a mix of effects or features appearing in two or more of the examples. Functionality shown at one location may also be provided at a different location in some embodiments; one of skill recognizes that functionality modules can be defined in various ways in a given implementation without necessarily omitting desired technical effects from the collection of interacting modules viewed as a whole. Distinct steps may be shown together in a single box in the Figures, due to space limitations or for convenience, but nonetheless be separately performable, e.g., one may be performed without the other in a given performance of a method.

Reference has been made to the figures throughout by reference numerals. Any apparent inconsistencies in the phrasing associated with a given reference numeral, in the figures or in the text, should be understood as simply broadening the scope of what is referenced by that numeral. Different instances of a given reference numeral may refer to different embodiments, even though the same reference numeral is used. Similarly, a given reference numeral may be used to refer to a verb, a noun, and/or to corresponding instances of each, e.g., a processor 110 may process 110 instructions by executing them.

As used herein, terms such as "a", "an", and "the" are inclusive of one or more of the indicated item or step. In particular, in the claims a reference to an item generally means at least one such item is present and a reference to a step means at least one instance of the step is performed. Similarly, "is" and other singular verb forms should be understood to encompass the possibility of "are" and other plural forms, when context permits, to avoid grammatical errors or misunderstandings.

Headings are for convenience only; information on a given topic may be found outside the section whose heading indicates that topic.

All claims and the abstract, as filed, are part of the specification.

To the extent any term used herein implicates or otherwise refers to an industry standard, and to the extent that applicable law requires identification of a particular version of such as standard, this disclosure shall be understood to refer to the most recent version of that standard which has been published in at least draft form (final form takes precedence if more recent) as of the earliest priority date of the present disclosure under applicable patent law.

While exemplary embodiments have been shown in the drawings and described above, it will be apparent to those of ordinary skill in the art that numerous modifications can be made without departing from the principles and concepts set forth in the claims, and that such modifications need not encompass an entire abstract concept. Although the subject matter is described in language specific to structural features and/or procedural acts, it is to be understood that the subject matter defined in the appended claims is not necessarily limited to the specific technical features or acts described above the claims. It is not necessary for every means or aspect or technical effect identified in a given definition or example to be present or to be utilized in every embodiment. Rather, the specific features and acts and effects described are disclosed as examples for consideration when implementing the claims.

All changes which fall short of enveloping an entire abstract idea but come within the meaning and range of equivalency of the claims are to be embraced within their scope to the full extent permitted by law.

What is claimed is:

1. A volatile memory device configured to identify within itself at least one of its own bad or at-risk volatile memory locations, the volatile memory device comprising:
   volatile memory cells, the volatile memory cells having respective failure susceptibility values, the volatile memory cells including at least one bad or at-risk memory location and including multiple other not-at-risk memory locations, the bad or at-risk memory location having a greater failure susceptibility value than the not-at-risk memory locations;
   read logic in operable communication with the volatile memory cells;
   write logic in operable communication with the volatile memory cells; and
   an exportable nonvolatile identification of the bad or at-risk volatile memory location, the exportable nonvolatile identification readable from outside the volatile memory device, whereby the volatile memory device is configured to self-document by identifying its own bad or at-risk volatile memory location in the exportable nonvolatile identification.

2. The memory device of claim 1, wherein the memory device is a dual inline memory module.

3. The memory device of claim 1, wherein the memory device includes pins and a package having an outer surface, and the pins and the outer surface form a physical boundary between the memory device and an ambient environment.

4. The memory device of claim 1, wherein the memory device comprises a fuse array, and wherein the exportable nonvolatile identification is implemented at least in part by a configuration of blown fuses in the fuse array.

5. The memory device of claim 1, wherein the memory device comprises a serial presence detect logic, and wherein the exportable nonvolatile identification is implemented at least in part by serial presence detect data which configures the serial presence detect logic.

6. The memory device of claim 1, wherein the exportable nonvolatile identification has at least one of the following bad or at-risk volatile memory location granularities: bit, partial row, partial column, full row, or full column.

7. The memory device of claim 1, wherein the exportable nonvolatile identification further includes at least one of the following:
- the failure susceptibility value of an at-risk memory location; or
- a fault code indicating a test which was failed by the memory cell located at the bad or at-risk memory location.

8. A method to identify at-risk volatile memory locations, the method comprising:
- obtaining a volatile memory device which is configured to identify at least one of its own at-risk volatile memory locations, the volatile memory device including volatile memory cells having respective failure susceptibility values, the volatile memory cells including at least one bad or at-risk volatile memory location and including multiple other not-at-risk volatile memory locations, the bad or at-risk volatile memory location having a greater failure susceptibility value than the not-at-risk volatile memory locations, the volatile memory device also including within itself a nonvolatile identification of the bad or at-risk volatile memory location;
- reading the nonvolatile identification from the volatile memory device; and
- utilizing the nonvolatile identification to perform at least one of the following:
  - check whether the nonvolatile identification matches memory test results which were generated by testing the volatile memory cells of the volatile memory device,
  - place an at-risk volatile memory location on a watch list identifying one or more volatile memory cells to be monitored for memory errors,
  - repair a volatile memory cell that is located at an at-risk volatile memory location,
  - exclude a volatile memory cell that is located at a bad or at-risk volatile memory location from holding data within a computing system, or
  - exclude the volatile memory device from holding data within a computing system.

9. The method of claim 8, wherein the method comprises excluding the identified volatile memory cell from use by mapping memory in a kernel.

10. The method of claim 8, further comprising entering nonvolatile identification data into the volatile memory device.

11. The method of claim 10, wherein entering nonvolatile identification data comprises blowing a fuse in a fuse array of the volatile memory device.

12. The method of claim 10, wherein entering nonvolatile identification data comprises employing an adapted post package repair procedure or an adapted repair after packaging procedure or both, to enter the nonvolatile identification data into the volatile memory device.

13. The method of claim 8, wherein reading comprises employing DQ pins of the memory device to read the nonvolatile identification.

14. The method of claim 8, wherein the volatile memory device serves as an authoritative source of the nonvolatile identification of at-risk volatile memory cells of the volatile memory device.

15. The method of claim 8, wherein the volatile memory device is installed in a computing device, and the method avoids reliance on any database which contains any identifications of at-risk volatile memory locations of volatile memory devices that are not installed in the computing device.

16. A method to identify at-risk volatile memory locations, the method comprising:
- obtaining a volatile memory device, the volatile memory device including volatile memory cells;
- ascertaining respective failure susceptibility values for the volatile memory cells, the volatile memory cells thereby including at least one at-risk volatile memory location and including multiple other not-at-risk volatile memory locations, the at-risk volatile memory location having a greater failure susceptibility value than the not-at-risk volatile memory locations; and
- entering a nonvolatile identification of the at-risk volatile memory location into the volatile memory device, thereby configuring the volatile memory device to identify within itself the at-risk volatile memory location, the nonvolatile identification readable from outside the volatile memory device.

17. The method of claim 16, wherein entering comprises blowing a fuse in a fuse array of the volatile memory device.

18. The method of claim 16, wherein entering comprises employing an adapted post package repair procedure to enter the nonvolatile identification into the volatile memory device.

19. The method of claim 16, further comprising reading the nonvolatile identification from the volatile memory device, and checking whether the nonvolatile identification read matches memory test results generated by testing the volatile memory cells of the volatile memory device.

20. The method of claim 16, wherein the method comprises entering multiple nonvolatile at-risk memory location identifications of different granularities into the volatile memory device.

* * * * *